United States Patent [19]

Midland

[11] Patent Number: 4,535,273
[45] Date of Patent: Aug. 13, 1985

[54] TRANSFORMERLESS SWITCHING CIRCUIT FOR DRIVING A HORIZONTAL OUTPUT TRANSISTOR

[75] Inventor: Richard W. Midland, Inverness, Ill.

[73] Assignee: Zenith Electronics Corporation, Glenview, Ill.

[21] Appl. No.: 641,633

[22] Filed: Aug. 17, 1984

Related U.S. Application Data

[63] Continuation of Ser. No. 312,583, Oct. 19, 1981, abandoned.

[51] Int. Cl.³ .................. H01J 29/70; H01J 29/76
[52] U.S. Cl. .................................... 315/401; 315/397
[58] Field of Search ............... 315/396, 397, 399, 401, 315/403, 408

[56] References Cited

U.S. PATENT DOCUMENTS

| | | | |
|---|---|---|---|
| 3,434,004 | 3/1969 | Smeulers et al. | 315/401 |
| 3,470,484 | 9/1969 | Gates | 315/396 |
| 3,688,154 | 8/1972 | Christopher | 315/401 |
| 4,052,645 | 10/1977 | Fujita | 315/401 |
| 4,096,416 | 6/1978 | Henley | 315/401 |
| 4,227,123 | 10/1980 | Dietz | 315/397 |

*Primary Examiner*—Theodore M. Blum
*Assistant Examiner*—Brian S. Steinberger

[57] ABSTRACT

A transformerless switching circuit is described for rapidly turning a horizontal output transistor off and on in response to horizontal rate input pulses. The switching circuit includes a first transistor which is rendered alternately conductive and non-conductive by the input pulses, a second transistor which supplies base drive to the horizontal output transistor in response to the first transistor being conductive, and a third transistor which turns off the horizontal output transistor rapidly in response to the first transistor being non-conductive. The conduction level of the second transistor is controlled by temperature compensating means such that base drive to the horizontal output transistor is varied to compensate for temperature induced current gain changes in the output transistor, thereby holding the latter transistor to a substantially constant saturation current.

6 Claims, 2 Drawing Figures

TRANSFORMERLESS SWITCHING CIRCUIT FOR DRIVING A HORIZONTAL OUTPUT TRANSISTOR

BACKGROUND OF THE INVENTION

This application is a continuation of application Ser. No. 312,583, filed 10/19/81, now abandoned.

This invention is generally directed to improvements in deflection systems for CRTs (Cathode Ray Tubes). It is particularly directed to an improved switching circuit for controlling the conduction of a horizontal output transistor in such a deflection system.

Deflection systems of the type under consideration include a horizontal output transistor which drives a flyback transformer for developing a deflection signal. To provide a proper deflection signal, the turn-on and turn-off times of the horizontal output transistor should be carefully controlled.

In many deflection systems, this control of the horizontal output transistor is provided by a switching circuit which responds to horizontal rate pulses for turning the output transistor off and on. Such switching circuits usually include a transformer which is coupled to the output transistor to provide base drive therefor. However, the use of a transformer can result in undesirably slow turn-off of the output transistor, in addition to increasing the cost of the switching circuit.

Another factor to be considered in the design of switching circuits is the need to accurately control the base current which is supplied to the horizontal output transistor. As the current gain of the output transistor varies with temperature, it's base drive should also vary to avoid driving the output transistor into heavy saturation. Carefully controlling the extent to which the output transistor saturates limits excessive heat dissipation and improves the transistor's turn-off time.

Although some switching circuits, such as that shown in U.S. Pat. No. 3,805,110, purport to eliminate the transformer, they do not compensate for temperature induced changes in the current gain of the horizontal output transistor.

Accordingly, it is a general object of the invention to provide an improved switching circuit for a horizontal output transistor.

It is a more specific object of the invention to provide a transformerless switching circuit which rapidly turns the horizontal output transistor off and on and which provides a temperature compensated base drive for the horizontal output transistor.

BRIEF DESCRIPTION OF THE FIGURES

The objects stated above and other objects of the invention are set forth more particularly in the following detailed description and in the accompanying drawings, of which.

DESCRIPTION OF THE PREFERRED EMBODIMENT

Figure 1:
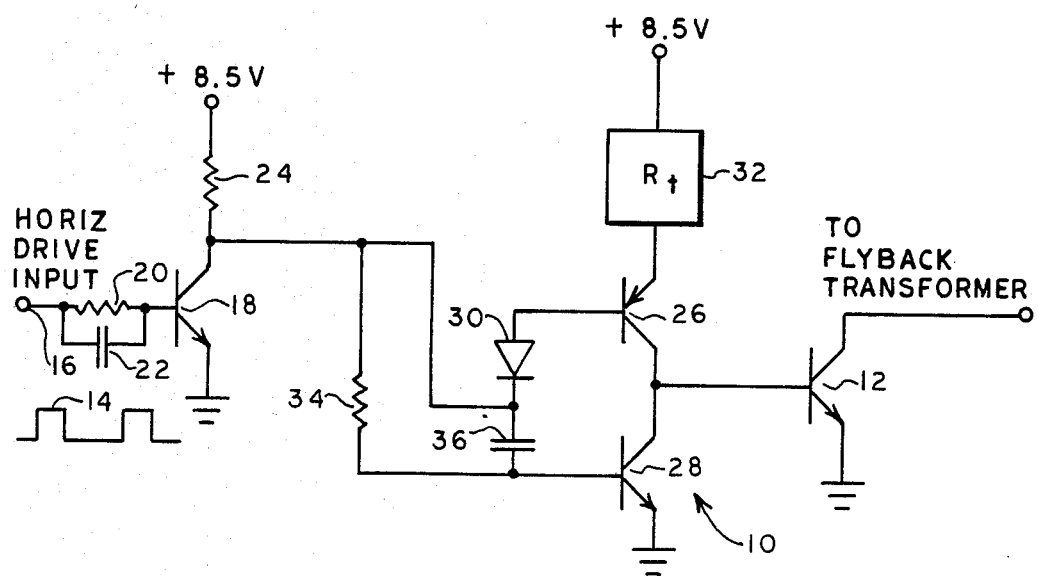
FIG. 1 is a circuit diagram of a switching circuit according to the invention.

Referring to FIG. 1, a switching circuit 10 is shown for driving a horizontal output transistor 12 in response to horizontal rate input pulses 14 received at an input terminal 16. As described more fully below, the switching circuit 10 eliminates the need for a transformer to drive the output transistor 12 and also provides for the latter transistor a base current drive which is temperature compensated to hold the saturation point of transistor 12 to a given low level. Accordingly, power dissipation is minimized and the transistor 12 is more easily turned off to develop a reproducible turn-off point.

The switching circuit includes a first transistor 18 whose base receives the input pulses via a resistor 20 in parallel with a speed-up capacitor 22. The emitter of transistor 18 is grounded and its collector is coupled through a load resistor 24 to a positive voltage source (+8.5 v). Thus, when the input pulses are high, the transistor 18 conducts and saturates to develop a low collector voltage; when the input pulses are low, the transistor 18 is non-conductive and its collector voltage is high. These high and low level voltages developed at the collector of transistor 18 are used to turn a PNP transistor 26 and an NPN transistor 28 off and on for regulating the on and off times of the horizontal output transistor 12.

Referring to the transistor 26, its base is coupled to the collector of the transistor 18 via a diode 30 so that, when the transistor 18 is conductive, the low voltage at its collector turns on the transistor 26. The diode 30 provides a voltage drop of about 0.06 volts across itself to bias the transistor 26 at its proper conduction level.

To inject base current into the transistor 12, the collector of transistor 26 is coupled to the base of the horizontal output transistor. In addition, a temperature compensating resistor 32, discussed more fully below, is serially coupled between the emitter of transistor 26 and the positive voltage supply. It can be seen that when one of the horizontal rate input pulses 14 is at a high level, the transistor 18 conducts and the transistor 26 responds by supplying base current to the horizontal output transistor 12.

To turn off the horizontal output transistor, the transistor 28 has its collector coupled to the base of the transistor 12, its emitter grounded, and its base coupled to the collector of transistor 18 via a resistor 34 and a parallel capacitor 36. Thus, when an input pulse goes low, the transistor 28 turns on to discharge to ground the potential at the base of transistor 12. The on condition of transistor 28 also provides a low impedance to ground for discharging any capacity between the collector and base of the horizontal output transistor. Consequently, the horizontal output transistor is turned off rapidly.

Figure 2:
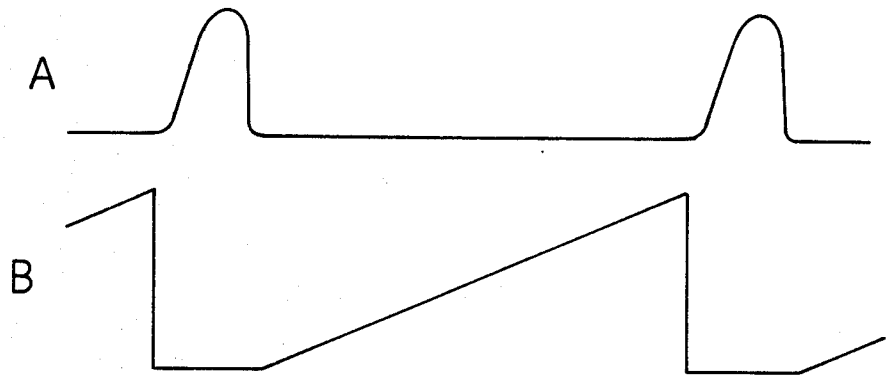
FIG. 2 illustrates waveforms useful in describing the operation of the switching circuit.

The result obtained by turning the transistor off and on are shown in FIG. 2. Waveform A represents flyback pulses developed between ground and the collector of the horizontal output transistor in the case where that transistor's collector is coupled to a conventional flyback transformer. Waveform B illustrates the collector current of transistor 12 which causes the generation of the flyback pulses.

Those skilled in the art will appreciate that the time at which the transistor 12 is turned off should be consistent. Variations in its turn-off time can cause the television receiver's raster scan to move in a horizontal direction. To avoid this problem, the saturation current of transistor 12 is held substantially constant, irrespective of temperature-induced variations in the current gain of the output transistor. This is achieved by the inclusion of the resistor 32 in the emitter of transistor 26.

The resistor 32 is preferably selected to be a low inductance wire wound resistor which has a temperature coefficient which compensates for temperature induced current gain variations in the transistor 12. For a typical horizontal output transistor, the resistor 32 is selected to have a temperature coefficient of about plus 0.4% per degree centigrade.

The compensating effect of resistor 32 occurs as follows. As ambient temperature increases, the current gain of transistor 12 also increases. Without some form of compensation, the increased current gain of transistor 12 would cause it to conduct an undesirably high saturation current. However, the impedance value of resistor 32 also increases with temperature, thereby reducing the emitter and collector currents of transistor 26 and reducing the base drive current for the horizontal output transistor. Hence, the saturation current of transistor 12 remains substantially constant.

When ambient temperature decreases, the current gain of transistor 12 decreases and the impedance value of resistor 32 also decreases, thereby increasing the base current drive for the output transistor. Once again, the saturation current of transistor 12 remains substantially constant.

The present switching circuit may be advantageously used in different types of CRT deflection systems. It is particularly useful in small, low cost deflection systems such as those incorporated in vehicle CRT displays, flight CRT displays and the like. Whatever its application, this switching circuit provides the advantage of being transformerless and of turning the horizontal output transistor off rapidly and at consistent turn-off times.

Although the invention has been described in terms of preferred structure, it will be obvious to those skilled in the art that many modifications and alterations may be made without departing from the invention. Accordingly, it is intended that all such alterations and modifications be considered as within the spirit and scope of the invention as defined by the appended claims.

I claim:

1. A transformerless, temperature compensated switching circuit for turning a horizontal output transistor off and on in response to horizontal rate input pulses, comprising:
    a first transistor responsive to the input pulses for alternately switching from a conductive state to a non-conductive state;
    a second transistor having a collector-emitter circuit coupled to the horizontal output transistor and being responsive to the conductive state of the first transistor for supplying base current from said collector-emitter circuit to the horizontal output transistor;
    temperature compensating means coupled to the collector-emitter circuit of the second transistor for varying the gain thereof and thereby the amplitude of the base current supplied to the hozizontal output transistor as a function of temperature so as to maintain the saturation current of the latter transistor substantially constant as its current gain changes with variations in temperature; and
    a third transistor coupled to the horizontal output transistor and responsive to the non-conductive state of the first transistor for providing a low impedance current discharge path at the base of the horizontal output transistor for rapidly turning off the latter transistor.

2. A switching circuit as set forth in claim 1 wherein said temperature compensating means includes a wire wound resistor whose temperature coefficient is selected to compensate for temperature induced current gain changes in the horizontal output transistor.

3. A switching circuit as set forth in claim 1 wherein the second and third transistors each have a base terminal coupled to the first transistor and a collector terminal coupled to a base terminal of the horizontal output transistor, and wherein said temperature compensating means includes a wire wound resistor coupled in series with an emitter terminal of the second transistor.

4. A switching circuit as set forth in claim 3 wherein said first transistor has a grounded emitter terminal, a base terminal receiving the horizontal rate input pulses, and a collector terminal which is coupled to the base terminals of the second and third transistors.

5. A switching circuit as set forth in claim 4 including a diode coupling the base terminal of the second transistor to the collector terminal of the first transistor.

6. A transformerless, temperature compensated switching circuit for turning a horizontal output transistor off and on in response to horizontal rate input pulses, comprising:
    a first transistor having a grounded emitter terminal, a base terminal receiving the horizontal rate input pulses, and a collector terminal, said first transistor being rendered alternately conductive and non-conductive by the input pulses;
    a second PNP transistor having a collector terminal coupled to a base terminal of the horizontal output transistor, having a base and an emitter terminal, and being responsive to conduction by the first transistor for supplying base current from its collector-emitter circuit to the horizontal output transistor;
    a temperature sensitive resistor coupled in series with the emitter terminal of the second transistor, said resistor having a temperature coefficient selected to vary the gain and thereby the base current supplied by the second transistor so as to maintain the saturation current of the horizontal output transistor substantially constant despite temperature induced variations in the current gain thereof; and
    a third NPN transistor having a grounded emitter terminal, having a collector terminal coupled to the base terminal of the horizontal output transistor, and having a base terminal coupled to the collector terminal of the first transistor so as to rapidly discharge the output transistor's base terminal in response to non-conduction of the first transistor.

* * * * *